United States Patent [19]

Schinella et al.

[11] 3,777,364

[45] Dec. 11, 1973

[54] METHODS FOR FORMING METAL/METAL SILICIDE SEMICONDUCTOR DEVICE INTERCONNECT SYSTEM

[75] Inventors: Richard D. Schinella, Mountain View; William H. Herndon, Sunnyvale, both of Calif.

[73] Assignee: Fairchild Camera and Instrument Corporation, Mountain View, Calif.

[22] Filed: July 31, 1972

[21] Appl. No.: 276,333

Related U.S. Application Data

[62] Division of Ser. No. 135,965, April 21, 1971, abandoned.

[52] U.S. Cl. ........................ 29/578, 29/590, 148/1.5

[51] Int. Cl. ............................................. B01j 17/00

[58] Field of Search .................. 29/578, 590; 156/3, 156/17; 317/234 L, 235 AT; 148/1.5, 186

[56] References Cited

UNITED STATES PATENTS

| | | | |
|---|---|---|---|
| 3,460,007 | 8/1969 | Scott | 317/235 |
| 3,653,120 | 4/1972 | Sirrine | 29/589 |
| 3,664,896 | 5/1972 | Duncan | 148/187 |

*Primary Examiner*—Charles W. Lanham
*Assistant Examiner*—W. C. Tupman
*Attorney*—Roger S. Borovoy et al.

[57] ABSTRACT

A silicide of a selected metal, typically platinum, is used to form an interconnect layer of conductive material on a semiconductor device. The silicide is, in one embodiment, formed by combining a layer of polycrystalline semiconductor material, formed into the desired interconnective lead pattern, with metal from a layer of metal formed over the polycrystalline semiconductor material. By oxidizing the region of the polycrystalline material not combined with the metal to form the metal silicide, the step height between the oxidized polycrystalline material and the metal silicide interconnect is significantly reduced relative to the interconnect structure of the prior art integrated circuits.

7 Claims, 9 Drawing Figures

METHODS FOR FORMING METAL/METAL SILICIDE SEMICONDUCTOR DEVICE INTERCONNECT SYSTEM

CROSS REFERENCE TO RELATED APPLICATION

This is a division of U. S. application Ser. No. 135,965 filed Apr. 21, 1971 and now abandoned.

BACKGROUND OF THE INVENTION

1. Field of the Invention

This invention relates to integrated circuits and in particular to structure for interconnecting the various regions in semiconductor material comprising integrated circuits, and to a process for making the structure.

2. Prior Art

Integrated circuits comprise active and passive elements formed in or upon the surface of a chip of semiconductor material and interconnected by one or more layers of leads formed on one surface of the semiconductor chip but separated from the surface and other layers of leads by dielectric material. Noyce, in U.S. Pat. No. 2,981,877, issued Apr. 25, 1961, discloses a semiconductor circuit with such a lead structure. One problem in attaching the conductive material to the active and passive regions of the underlying semiconductor material has been to control the diffusion of the contact material in the underlying semiconductor material. In the case of aluminum, for example, this diffusion changes the conductivity, in some cases, of the underlying semiconductor material. Moore and Noyce in U.S. Pat. No. 3,108,359, issued Oct. 29, 1963, discuss a technique by which aluminum is used to contact both N and P type silicon material. Moore and Noyce describe a method by which aluminum, which acts as a P type impurity, is used to contact N type regions in the underlying semiconductor material. Another technique of contacting semiconductor material, and particularly silicon, is described by M. P. Lepselter in an article published in the February 1966 issue of the Bell System Technical Journal, page 233, entitled "Beam Lead Technology." Lepselter discloses the use of a $Pt_5Si_2$ contact material placed over the regions of semiconductor material. As described on page 243 of this article, the "platinum in the holes will react with the silicon to form $Pt_5Si_2$, which is a solid phase and will not ball up or creep beyond the edges of the contact holes as a liquid eutectic would." In U.S. Pat. No. 3,287,612 issued Nov. 22, 1966, Lepselter discloses the use of a platinum film on a semiconductor material to form a contact. There, Lepselter states "the platnium film tends to gather in small islands 14 both on the silicon surface and on the oxide surface. . . the areas on the silicon form goods ohmic contacts to the P-type zone 13 as a consequence of the solid phase reaction." (Lepselter, column 2, lines 46 to 52.) To form the conductive interconnects between the regions on the semiconductor material, Lepselter discloses the use of a titanium-platinum-gold layered structure. (Lepselter, column 4, lines 7–9).

Schneer et al in a paper entitled "A Metal-Insulator-Silicon Junction Seal" published in the IEEE Transactions on Electron Devices, Volumne ED-15 No. 5, May 1968, page 290, disclose a junction seal consisting of platinum silicide-titanium-platinum-gold contacts and a silicon nitride layer adjacent to and in contact with the contacts to seal the junctions.

SUMMARY OF THE INVENTION

This invention provides a new interconnect structure for interconnecting regions of semiconductor material to form a desired integrated circuit. The interconnect structure of this invention allows the use of silicon nitride over the first interconnect layer to seal this layer and to prevent ions from traveling through the dielectric to contaminate the semiconductor regions.

According to this invention a silicide of a selected metal is used to form an interconnect layer of conductive material on a semiconductor device. This silicide is, in one embodiment, formed in such a manner as to reduce the step height over the conductive leads.

In accordance with the process of this invention, regions are formed in semiconductor material by first forming windows in a dielectric layer formed on one surface of the semiconductor material and then diffusing selected impurities through these windows. Next a layer of polycrystalline silicon is formed over the dielectric and within the windows. A silicon nitride layer is then formed on top of the polycrystalline silicon layer and selected portions of the silicon nitride layer are removed to leave exposed underlying portions of the polycrystalline silicon in the field of the device, that is in the region of the surface not to be covered either by contacts to the regions of the semiconductor material or by conductors interconnecting these regions into the desired circuit. Alternatively the selected portions of the nitride layer can be anodized instead of removed.

The wafer with the silicon nitride mask overlying selected portions of the polycrystalline silicon is then placed in an oxidizing environment and the polycrystalline silicon is oxidized. The nitride overlying selected contact windows is then removed and selected impurities are diffused through the polycrystalline silicon into the underlying semiconductor material to form desired regions in the semiconductor material. Typically these regions are emitter and collector contact regions. Next, any remaining silicon nitride is removed from the surface of the device and a metal layer is formed on the surface. The wafer is heated to form a metal silicide between the metal and the underlying polycrystalline silicon. The metal silicide not only contacts the underlying regions in the semiconductor wafer but also serves as an interconnective lead pattern. The remaining metal is then removed. Next, a layer of dielectric, typically silicon nitride, is formed over the metal silicide and the underlying dielectric on the surface of the device. If desired, a second layer interconnect pattern can then be formed on top of the exposed dielectric. This second interconnect pattern contacts the underlying metal silicide and semiconductor regions, as desired, through windows in the intervening dielectric.

Alternatively, the metal silicide interconnect pattern can be formed by removing the underlying polycrystalline silicon in the field of the device instead of oxidizing this silicon and then forming the metal layer. Heating the device results in a metal silicide forming where the polycrystalline silicon remains.

The formation of part of the first layer oxide from the polycrystalline silicon results in the metal silicide layer being depressed into or raised above the underlying oxide depending on the composition of the metal silicide. The result is a small step between the oxide and the metal silicide thereby reducing the formation of microcracks in the second and subsequent lead interconnect patterns due to steps in the first and underlying lead interconnect pattern.

This invention will be more fully understood in conjunction with the following detailed description taken together with the drawings.

DETAILED DESCRIPTION

Figure 1:
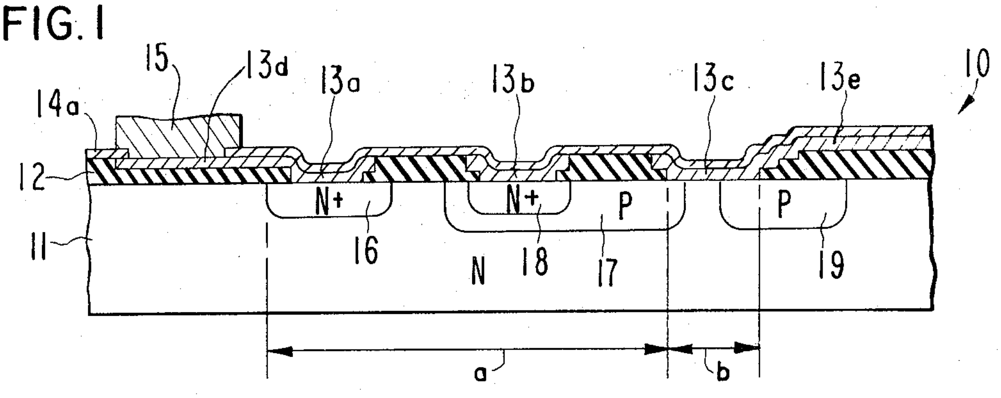
FIG. 1 shows a cross-sectional view of a portion of a semiconductor wafer fabricated in accordance with this invention.

A portion of a cross-section of a semiconductor wafer 10 produced in accordance with this invention is shown in FIG. 1. Wafer 10 comprises semiconductor substrate 11 in which are formed a plurality of regions 16, 17, 18 and 19. It should be noted that regions 17 and 19, although shown as separated in FIG. 1, are typically different sections of the same annular-shaped region. Formed on one surface of semiconductor substrate 11 is dielectric 12. Dielectric 12 is comprised of a single material or a composite of several materials. In accordance with this invention dielectric 12 is, in one embodiment, produced from two layers, a first layer of silicon oxide formed by any of several well-known techniques and a second layer of silicon oxide formed by selectively oxidizing a layer of polycrystalline silicon placed on the first layer of insulation.

A first layer of conductive material 13 formed into an interconnective lead pattern is placed on top of dielectric 12. This layer contacts regions 16, 17, 18 and 19 through windows formed in dielectric 12. Typically, this layer forms ohmic contacts with these regions. However, by controlling the doping of underlying regions of semiconductor material 11, a Schottky barrier junction can also be formed, if desired. Layer 13 is formed into contacts 13*a*, 13*b* and 13*c* to the underlying regions 16, 18 and 17, 19 in wafer 11, and is also formed into interconnective leads 13*d* and 13*e* interconnecting the regions within the semiconductor wafer to form the desired integrated circuit. That portion of contact 13*c* touching N-type material 11 acts as a Schottky barrier diode. Layer 13, as will be described in detail later, comprises a metal silicide.

Placed over the metal silicide interconnect pattern and the exposed regions of dielectric layer 12 is a layer of a second dielectric 14, typically silicon nitride. Contact to the lead 13*d* is made from a second layer interconnect pattern 15 through a window in dielectric layer 14.

The preferred embodiment of this invention is formed on a silicon semiconductor wafer. It should be noted however, that the metal silicide interconnects and contacts used with this invention can be used with semiconductor materials other than silicon, such as germanium and gallium arsenide. In addition, the preferred embodiment will be described using a platinum silicide for the first layer of interconnects and an oxide of silicon for the first dielectric layer. However, the invention is appropriate for use with a wide variety of different metals, which form with silicon an appropriate conductive metal silicide structure and with different types of dielectrics.

It should be noted that while the prior art teaches the use of platinum silicide for contacts to regions in a silicon semiconductor wafer, the platinum silicide is formed from the combination of platinum directly with the silicon in the underlying semiconductor wafer. Difficulty is encountered in the prior art in having the platinum adhere to an oxide layer on the surface of a silicon wafer. This invention overcomes this difficulty by forming the platinum on a polycrystalline silicon material which adheres strongly to the underlying oxide (dielectric layer 12, FIG. 1). The platinum then is combined with the polycrystalline silicon to form platinum silicide by heating. The platinum silicide thus formed adheres strongly to dielectrics. Other advantages resulting from the invented structure and process will be apparent in view of the following description of the process for obtaining the structure shown in FIG. 1.

Figure 2A:
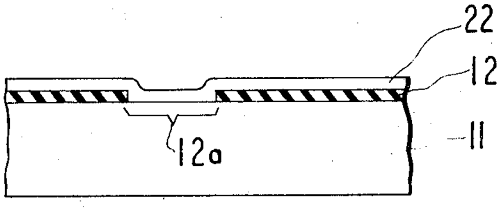
FIGS. 2*a* through 2*h* illustrate the various steps required to obtain a device in accordance with this invention.
Figure 2B:
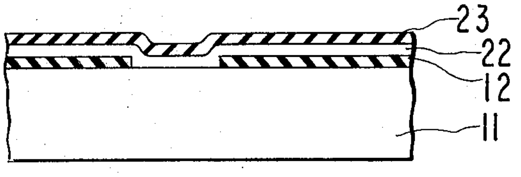

FIG. 2*a* shows a portion 11 broken from a larger slice of silicon for the purpose of illustrating the process of this invention. It should be understood that the process of this invention is implemented on a semiconductor wafer containing a plurality of semiconductor dice. The dice are broken from the wafer after the process has been completed. For convenience in describing the process of this invention, only one region will be shown formed in the semiconductor material and only a small portion of the wafer thus will be illustrated. Thus the following description is illustrative only and is not intended to limit the process described to production of the device shown.

A dielectric layer 12, typically a silicon oxide, is formed on the top surface of silicon 11. A window 12*a* (FIG. 2*a*) is next formed in oxide layer 12 using well known photolighorgraphic and etching techniques. This window will allow selected impurities to be diffused into silicon 11.

Next, a layer 22 of polycrystalline silicon is formed over the top surface of oxide layer 12 and those portions of silicon 11 exposed by window 12*a*. A variety of techniques can be used to form polycrystalline silicon layer 22. The preferred technique is, however, to deposit polycrystalline silicon layer 22 from the pyrolysis of silane. Next, the polycrystalline silicon layer 22 is covered with a layer of silicon nitride 23. The portions of silicon nitride 23 overlying contact regions to underlying silicon 11 and the future locations of conductive leads which interconnect regions with silicon 11 are left on polycrystalline layer 22. The remainder of the silicon nitride layer 23 is removed by well known photolithographic and etching techniques. Alternatively, the remainder of the silicon nitride can be anodized to form a layer of silicon oxide rather than removed.

Figure 2C:
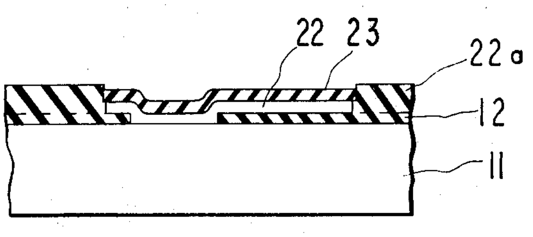

Wafer 11 is now placed in an oxidizing environment and the polycrystalline silicon layer 22 exposed by removal of portions of nitride layer 23 is oxidized. Alternatively, when the overlying nitride is anodized, the polycrystalline silicon may be oxidized through the anodic silicon oxide layer. The resulting oxidized polycrystalline silicon 22*a* forms an adherent bond with the underlying silicon oxide layer 12. However, polycrystalline silicon 22 beneath silicon nitride 23 is protected by this nitride and thus is not oxidized. FIG. 2*c* shows the resulting structure. It should be noted that during the oxidation of the polycrystalline silicon, the oxidized silicon grows by a factor of about 2.2 in thickness.

Figure 2D:
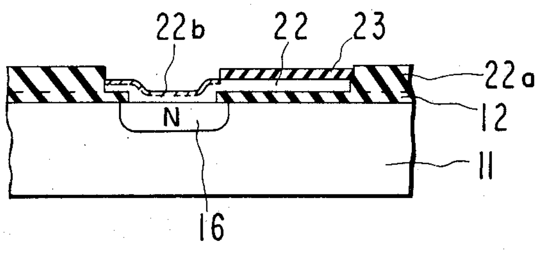

Next, those portions of silicon nitride layer 23 overlying selected windows in oxide layer 12 are removed. A selected impurity, typically phosphorus if it is desired to form an N type region, is diffused through polycrystalline silicon material 22 exposed by the partial removal of nitride layer 23. N type region 16 is thus formed beneath window 12*a* (FIGS. 2*d* and 2*a*). Typically, this predeposition occurs at between 800°C and 1,000°C and forms an emitter region, a collector contact, or any one of various other types of diffused regions.

During diffusion, a thin layer 22*b* of phosphorus glass forms over the top of polycrystalline silicon 22. A dilute hydrofluoric acid dip removes phosphorus glass layer 22*b*. While in the prior art an emitter wash of this type was considered dangerous in that it undercut the adjacent oxide and thus exposed the intersection of the PN junction with the surface of silicon 11 to contaminants and to possible metal shorting during metallization, in this situation, the emitter wash merely removes the phosphorus glass formed on the top surface of polycrystalline layer 22 but does not penetrate through polycrystalline silicon layer 22 to degrade the characteristics of the underlying PN junction. The emitter-base junction thus remains passivated. During the diffusion of region 16, the nitride 23 remaining on the polycrystalline silicon 22 protects the underlying polycrystalline silicon from being doped with the dopants used to form region 16. This polycrystalline silicon will later be used in the forming of the interconnect and contact structure.

The remainder of nitride layer 23 (FIG. 2*d*) is now removed.

Figure 2E:
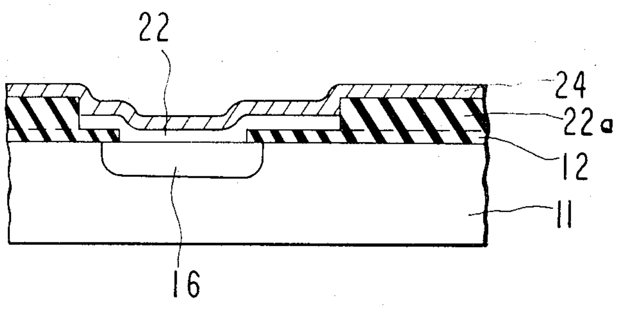

A layer 24 of platinum (FIG. 2*e*) is next formed on the top surface of the device to cover both the polycrystalline silicon 22 and the oxidized portions 22*a* of polycrystalline silicon. Typically, the platinum 24 is deposited to a thickness of about 750 angstroms for every 1,000 angstroms of thickness of the polycrystalline silicon. The wafer is heated at typically 850°C or lower to allow the platinum to react with the underlying polycrystalline silicon, and thus to form a platinum silicide. The compound is formed by a chemical reaction limited by the solid state diffusion of the two materials into each other. Hence the formation of a liquid phase during the formation of a platinum silicide is avoided. A wide variety of temperatures were tried during the formation of the platinum silicide. For a platinum silicide layer of about 1,750 angstroms, the platinum silicide was observed to crack if the platinum silicide was formed above 875°C. As the platinum silicide thickness increases, the maximum temperature at which the silicide can be formed without cracks developing decreases.

The platinum forms a silicide only over the polycrystalline silicon but not over the oxide. Because the polycrystalline silicon has been formed into the desired interconnect pattern and contacts, the platinum silicide is now in the shape of the desired interconnect pattern and contacts.

Figure 2F:
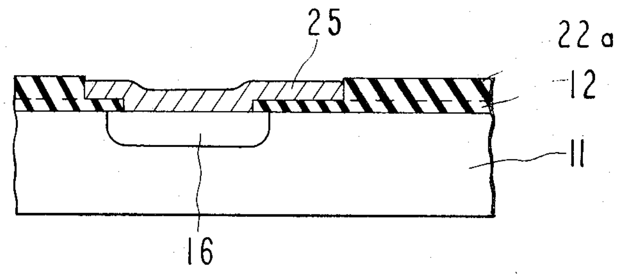
Figure 2G:
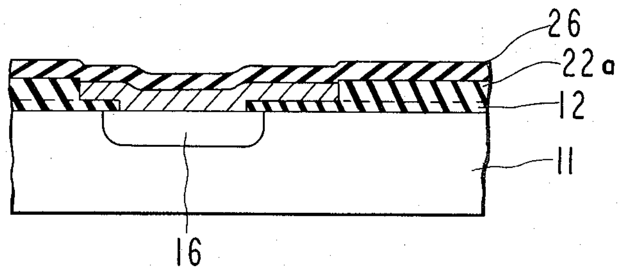
Figure 2H:
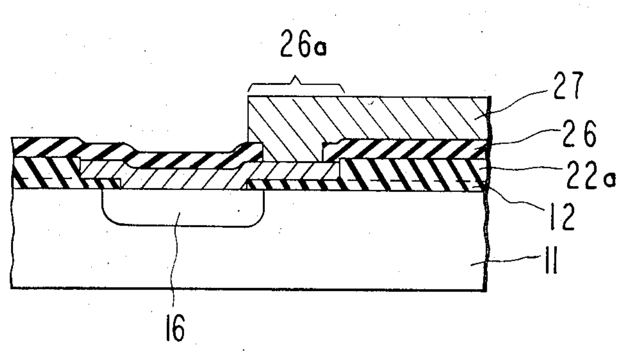

The unreacted platinum is next removed from the surface of the wafer. In one embodiment this is done by the use of a hot aqua regia dip. The resulting structure is shown in FIG. 2*f*.

The oxidized polycrystalline silicon 22*a* has grown by a factor of about 2.2 in thickness over its original thickness. The platinum silicide region 25 has grown about 1.75 times the thickness of the original polycrystalline silicon 22. It should be noted that the thickness of the oxidized polycrystalline silicon is as much as 25 percent more than thickness of the platinum silicide. Generally more than one phase of platinum silicide is formed. These other phases are thicker than PtSi for a given initial polycrystalline silicon thickness resulting in a structure wherein the surfaces of the platinum silicide and oxidized polycrystalline silicon are more nearly coplanar. FIG. 2*f* shows the structure at this stage. The top surfaces of the platinum silicide 25 and oxidized polycrystalline silicon 22*a* are shown in slightly different planes.

In one embodiment, after the first layer interconnect patterns have been formed from platinum silicide, a layer of dielectric 26, typically, silicon nitride, is formed over the top surface of the device to seal this surface and to prevent ionic contaminants, particularly sodium ions, from migrating to the interface between silicon 11 and silicon dioxide 12 and there changing the characteristics of the device (FIG. 2*a*).

If it is desired to place a second layer interconnect pattern on the wafer, windows are next formed in dielectric layer 26. A second layer of metal 27, which typically can be aluminum or any other conductive material, is then formed over the top surface of the device. Pinholes in the mask used to define windows, such as window 26*a*, have limited effect on device yield because the etch used to remove the aluminum has no effect on platinum silicide. Thus to some extent the device is produced by a failsafe process.

The following advantages are gained by use of the process of this invention. First, the platinum silicide interconnect pattern can be coated with a dielectric such as silicon nitride formed at a high temperature to seal the device against ionic contamination without significantly altering the device characteristics.

The platinum silicide conductive material is corrosion resistant and, in addition, the silicon nitride also inhibits corrosion.

No microcrack failures exist because the silicide is formed from polycrystalline silicon films deposited by gas phase pyrolysis of silane. These films remain continuous in passing over large steps on the substrate.

Platinum silicide is insensitive to electromigration failures.

Because the metal silicide interconnect pattern is defined by defining the polycrystalline silicon layer rather than by defining a metal layer, tighter masking tolerances result.

In two layer interconnect systems the metal silicide first layer interconnect film is formed in a way which yields a substantially flat or plane surface, thereby minimizing the problem of second layer interconnect lines cracking over large steps on the surface of the device caused by the first layer interconnects. The plane first layer interconnect film results in simpler, higher-yield, the second layer masking.

Sinc many metal silicides do not react appreciably with buffered HF solutions, the etching of windows in the dielectric between the first and second layer interconnects is considerably simplified.

Certain metal silicides are relatively inert and do not oxidize easily thereby reducing the problem of poor electrical contacts between first and second layer interconnect films when the first layer interconnect is one of the silicides. This allows storage of the wafer for some time between the formation of the first and second interconnect layers.

Inherently higher reliability is obtained using platinum silicide interconnects than with conventional devices employing all metal interconnect systems which are susceptible to corrosion, electromigration and microcracks failure phenomenon.

Platinum silicide has a lower sheet resistivity than does doped polycrystalline silicon and can be used to ohmically contact both P and N type regions.

What is claimed is:

1. The method of forming an interconnect layer in an integrated circuit which includes a dielectric formed on one surface of semiconductor material of one conductivity type, windows in said dielectric, and regions of opposite conductivity type formed in said semiconductor material beneath at least some of these windows, which comprises:

forming a layer of polycrystalline semiconductor material over said dielectric and over the portions of said underlying semiconductor material exposed by said windows in said dielectric;

forming a silicon nitride layer on top of the polycrystalline semiconductor material;

removing selected portions of said silicon nitride layer to leave exposed underlying portions of the polycrystalline semiconductor material over-lying the regions of said one surface not to be covered either by contacts to the underlying regions formed in the semiconductor material or by conductors interconnecting these regions into a desired circuit;

oxidizing the polycrystalline semiconductor material exposed by removing said silicon nitride;

removing the silicon nitride overlying selected regions in said semiconductor material;

diffusing selected impurities through the polycrystalline semiconductor material exposed by removing said silicon nitride to form additional regions in the semiconductor material;

removing the remaining silicon nitride from said polycrystalline semiconductor material;

forming a metal layer on the surface of said device;

forming a metal silicide between the metal and underlying polycrystalline semiconductor material; and removing the remaining metal not formed into a metal silicide from the device.

2. The method of claim 1 wherein said metal silicide is formed by heating the wafer to a selected temperature.

3. The method of claim 2 wherein said metal is platinum.

4. The method of claim 3 wherein said platinum silicide is formed by heating said wafer to a temperature less than 875°C.

5. The method of claim 1 wherein said step of removing selected portions of said silicon nitride layer to leave exposed underlying portions of the polycrystalline semiconductor material overlying the regions of said one surface not to be covered either by contacts to the underlying regions formed in the semiconductor material or by conductors interconnecting these regions into a desired circuit is replaced by the step of anodizing said selected portions of said silicon nitride layer.

6. The method in claim 5 wherein said platinum is formed to a thickness of approximately 750 angstroms and said polycrystalline semiconductor material is formed to a thickness of approximately 1,000 angstroms.

7. The method of claim 5 wherein said semiconductor material is silicon.

* * * * *